(12) United States Patent
Su et al.

(10) Patent No.: US 10,847,564 B1
(45) Date of Patent: Nov. 24, 2020

(54) CHARGE RELEASE LAYER TO REMOVE CHARGE CARRIERS FROM DIELECTRIC GRID STRUCTURES IN IMAGE SENSORS

(71) Applicant: Taiwan Semiconductor Manufacturing Co., Ltd., Hsin-Chu (TW)

(72) Inventors: Ching-Chung Su, Tainan (TW); Jiech-Fun Lu, Madou Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/520,742

(22) Filed: Jul. 24, 2019

(51) Int. Cl.
  *H01L 27/146* (2006.01)
(52) U.S. Cl.
  CPC .. *H01L 27/14638* (2013.01); *H01L 27/14621* (2013.01); *H01L 27/14636* (2013.01); *H01L 27/14645* (2013.01); *H01L 27/14685* (2013.01); *H01L 27/14694* (2013.01)
(58) Field of Classification Search
  CPC ......... H01L 27/14638; H01L 27/14621; H01L 27/14685; H01L 27/14645; H01L 27/14636; H01L 27/14694
  See application file for complete search history.

(56) References Cited

U.S. PATENT DOCUMENTS

| | | | |
|---|---|---|---|
| 6,642,541 B2 | 11/2003 | Nagata et al. | |
| 7,566,853 B2 | 7/2009 | Tuckerman et al. | |
| 8,054,371 B2 | 11/2011 | Wang et al. | |
| 9,683,890 B2 | 6/2017 | Skorka et al. | |
| 9,818,776 B2 | 11/2017 | Borthakur et al. | |
| 10,319,777 B2 | 6/2019 | Sakano | |
| 10,504,956 B2 | 12/2019 | Goto et al. | |
| 2006/0049412 A1 | 3/2006 | Cho | |
| 2010/0276736 A1 | 11/2010 | Bocko et al. | |
| 2011/0108938 A1* | 5/2011 | Nozaki | H01L 27/14621 257/432 |
| 2015/0155320 A1* | 6/2015 | Chien | H01L 27/14623 257/432 |
| 2016/0307941 A1* | 10/2016 | Cheng | H01L 27/1463 |
| 2016/0307942 A1* | 10/2016 | Cheng | H01L 27/1464 |
| 2017/0077163 A1* | 3/2017 | Chou | H01L 27/14627 |
| 2017/0110501 A1* | 4/2017 | Hsu | H01L 27/14645 |
| 2017/0229494 A1 | 8/2017 | Hsu et al. | |
| 2017/0278893 A1* | 9/2017 | Cheng | H01L 27/1463 |
| 2018/0286907 A1* | 10/2018 | Su | H01L 27/14643 |
| 2019/0267420 A1* | 8/2019 | Lee | H01L 27/14603 |

FOREIGN PATENT DOCUMENTS

CN  101996261 A  3/2011

\* cited by examiner

*Primary Examiner* — Ahmed N Sefer
(74) *Attorney, Agent, or Firm* — Eschweiler & Potashnik, LLC

(57) ABSTRACT

Various embodiments of the present disclosure are directed towards an image sensor including a charge release layer. A photodetector is disposed within a semiconductor substrate. An etch stop layer overlies the photodetector. A color filter overlies the etch stop layer. A dielectric grid structure surrounds the color filter. The charge release layer is sandwiched between the dielectric grid structure and the etch stop layer. The charge release layer surrounds the color filter and comprises a conductive material. The charge release layer directly contacts the color filter.

20 Claims, 12 Drawing Sheets

CHARGE RELEASE LAYER TO REMOVE CHARGE CARRIERS FROM DIELECTRIC GRID STRUCTURES IN IMAGE SENSORS

BACKGROUND

Integrated circuits (IC) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
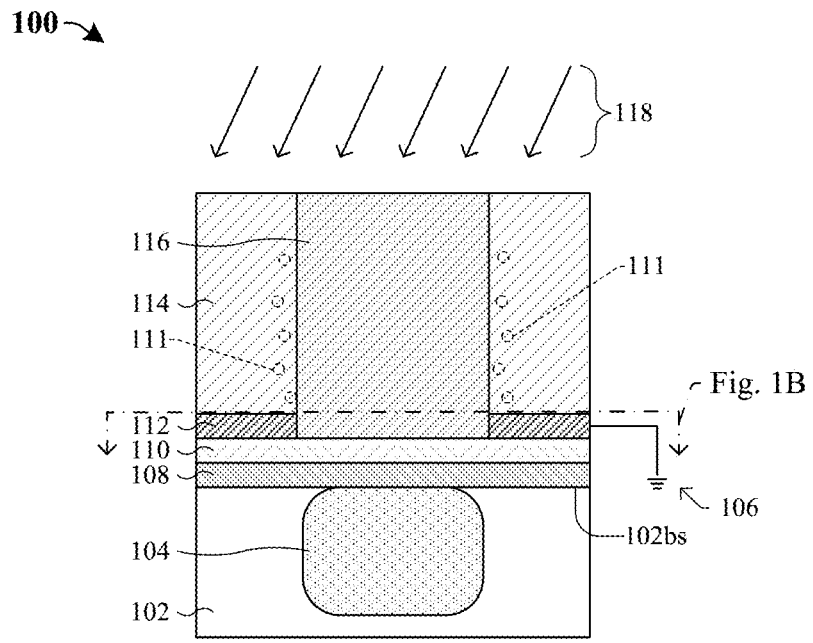
FIG. 1A illustrates a cross-sectional view of some embodiments of an image sensor including a charge release layer disposed around a color filter.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Image sensors include an array of photodetectors. Some image sensors include a semiconductor substrate with photodetectors arranged within the semiconductor substrate and a pixel device structure underlying the semiconductor substrate. The pixel device structure includes an interconnect structure and pixel devices (e.g., source follower transistors, reset transistors, charge release transistors, etc.) disposed on a front-side surface of the semiconductor substrate. The pixel devices may be electrically coupled to the photodetectors through the interconnect structure. Color filters and a dielectric grid structure are respectively disposed on a back-side surface of the semiconductor substrate and overlie the photodetectors. The dielectric grid structure laterally surrounds the color filters. The dielectric grid structure increases sensitivity (e.g., quantum efficiency (QE)) and reduces cross-talk by total internal reflection off the dielectric grid structure. However, depending on how the dielectric grid structure is formed, the dielectric grid structure may also reduce a quality of black and/or dark images produced from the image sensor.

In some embodiments, the dielectric grid structure may be formed by performing an etch process (e.g., a dry etch process) into one or more dielectric layers overlying the photodetectors. This exposes an upper surface of an etch stop layer and defines a plurality of color filter openings overlying the photodetectors. A deposition process is performed to deposit color filters in the plurality of color filter openings over the upper surface of the etch stop layer. However, after performing the etch process, charge carriers (e.g., electrons) may be trapped in the dielectric grid structure. This, in part, may be due to the etching process and/or the deposition process. The trapped charge carriers remain in the dielectric grid structure and may reduce a reliability and/or accuracy of images produced from the image sensor. For example, if the image produced from the image sensor is supposed to be black and/or dark, then the trapped charge carriers may cause a gray color to appear in the black and/or dark image. Further, the trapped charge carriers may increase dark current and/or a number of white pixels in the image sensor. Furthermore, ultra-violet (UV) curing processes are unable to remove the trapped charge carriers from the dielectric grid structure.

In some alternative embodiments, the present application is directed to a dielectric grid structure that prevents the accumulation of trapped charge carriers in the dielectric grid structure. For example, to remove the trapped charge carriers in an image sensor, a charge release layer may underlie the dielectric grid structure. The charge release layer is formed between the dielectric grid structure and the etch stop layer. An etch process is performed on the dielectric grid structure and the charge release layer until an upper surface of the etch stop layer is exposed, thereby defining a plurality of color filter openings. A deposition process is performed to deposit color filters in the plurality of color filter openings, such that the charge release layer and the dielectric grid structure laterally surround the color filters. During and/or after performing the deposition process, charge carriers (e.g., electrons) that may be trapped in the dielectric grid structure are released through the charge release layer. For example, the charge release layer may be electrically coupled to ground, such that the charge carriers travel from the dielectric grid structure to ground. This, in part, increases a reliability and/or an accuracy of images produced from the image sensor, removes a gray color from dark images (e.g., black images) produced from the image sensor, decreases a dark current in the image sensor, and/or decreases a number of white pixels in the image sensor.

Referring to FIG. 1A, a cross-sectional view of some embodiments of an image sensor 100 including a charge release layer 112 surrounding a color filter 116 is provided.

A photodetector 104 is disposed within the semiconductor substrate 102. In some embodiments, the semiconductor substrate 102 comprises any type of semiconductor body (e.g., monocrystalline silicon/CMOS bulk, silicon-germanium (SeGe), silicon on insulator (SOI), etc.) and/or has a first doping type (e.g., p-type doping). The photodetector 104 is configured to convert electromagnetic radiation 118 (e.g., photons) into electrical signals. For example, the photodetector 104 may generate electron-hole pairs from the electromagnetic radiation 118. The photodetector 104 comprises a second doping type (e.g., n-type doping) opposite the first doping type. In some embodiments, the first doping type is p-type and the second doping type is n-type, or vice versa. A stack of dielectric layers 108 overlies a back-side surface 102$bs$ of the semiconductor substrate 102. The stack of dielectric layers 108 may comprise one or more oxide layers and is configured to protect the back-side surface 102$bs$ of the semiconductor substrate 102.

An etch stop layer 110 overlies the stack of dielectric layers 108 and a charge release layer 112 overlies the etch stop layer 110. A dielectric grid structure 114 overlies the charge release layer 112. The charge release layer 112 may comprise a conductive material, such as titanium nitride. The dielectric grid structure 114 and the charge release layer 112 surround a color filter 116. The dielectric grid structure 114 is a dielectric material with a refractive index less than a refractive index of the color filter 116. Due to the lower refractive index, the dielectric grid structure 114 serves as a radiation guide to direct electromagnetic radiation 118 to a corresponding photodetector 104. For example, electromagnetic radiation 118 within the color filter 116 that strikes the boundary between the color filter 116 and the dielectric grid structure 114 typically undergoes total internal reflection. Thus, the dielectric grid structure 114 is configured to increases sensitivity (e.g., quantum efficiency (QE)) of the image sensor 100 while reducing cross-talk between neighboring photodetectors. Further, the color filter 116 is configured to block a first range of frequencies of the electromagnetic radiation 118 while passing a second range of frequencies of the electromagnetic radiation 118 to the underlying photodetector 104.

During a formation of the image sensor 100 one or more etch processes may be performed on the dielectric grid structure 114 to define openings for the color filter 116. During the one or more etch processes, charge carriers 111 (e.g., electrons) may buildup and/or be trapped in the dielectric grid structure 114. The trapped charge carriers 111 may reduce a reliability and/or accuracy of images produced from the image sensor 100. Therefore, the charge release layer 112 is electrically coupled to ground 106, such that the charge carriers 111 travel from the dielectric grid structure 114 to ground 106 by way of the charge release layer 112. Thus, the charge release layer 112 is configured to facilitate removing the buildup of charge carriers 111 from the dielectric grid structure 114 and/or other adjacent structures/layers (e.g., the etch stop layer 110 and/or the stack of dielectric layers 108). By removing the charge carriers 111, a reliability and an accuracy of images produced from the image sensor 100 is increased, a dark current in the image sensor 100 is decreased, and/or a number of white pixels in the image sensor 100 is decreased. In further embodiments, the charge release layer 112 is directly electrically coupled to a charge release circuit (e.g., comprising a microcontroller) (not shown) configured to remove the trapped charge carriers 111 from the dielectric grid structure 114.

Figure 1B:
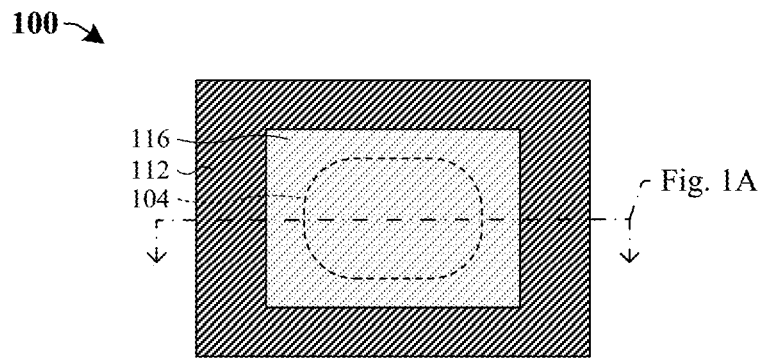
FIG. 1B illustrates a top view of some embodiments of the image sensor of FIG. 1A, as indicated by the cut-lines in FIGS. 1A and 1B.

Referring to FIG. 1B, a top view of some embodiments of the image sensor 100 of FIG. 1A is provided.

The charge release layer 112 encloses an outer perimeter of the color filter 116. The color filter 116 may have, for example, a square, a rectangular, a circular, or an elliptical shape when viewed from above. In some embodiments, the charge release layer 112 directly contacts the outer perimeter of the color filter 116. The photodetector 104 is laterally spaced between inner sidewalls of the charge release layer 112.

Figure 2A:
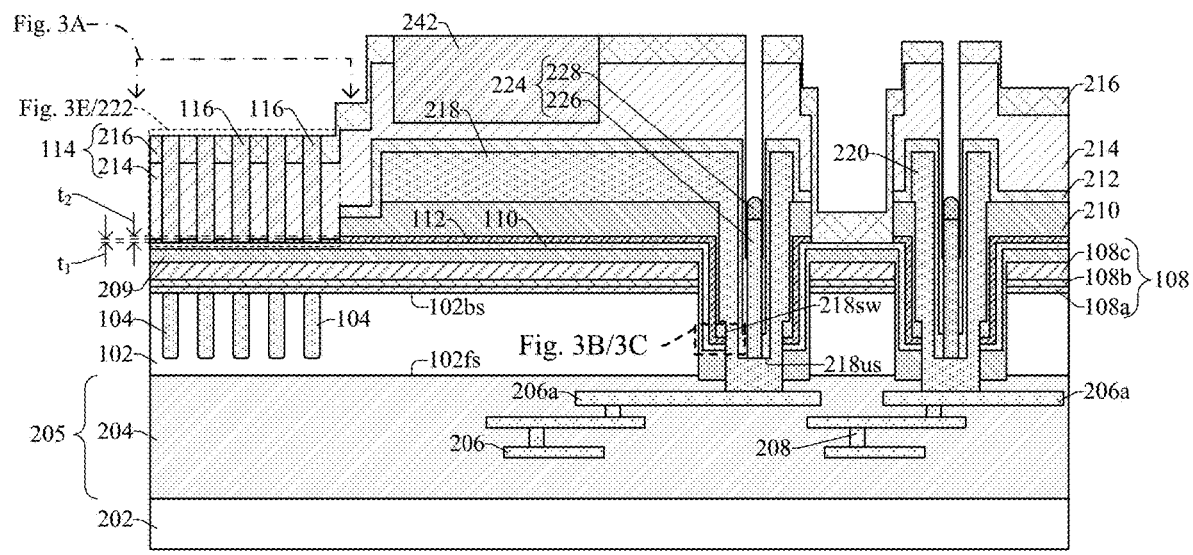
FIGS. 2A, 2B, 2C, and 2D illustrate cross-sectional views of some embodiments of an image sensor including a charge release layer disposed around a plurality of color filters.

Referring to FIG. 2A, a cross-sectional view of some embodiments of an image sensor 200$a$ including a dielectric grid structure 114 laterally offset from a bond structure 224 (in some embodiments, referred to as a ground pad or a ground terminal) is provided.

A semiconductor substrate 102 overlies a carrier substrate 202. In some embodiments, the semiconductor substrate 102 and/or the carrier substrate 202 may, for example, be a bulk substrate (e.g., a bulk silicon substrate), a silicon-on-insulator (SOI) substrate, or some other suitable substrate. A plurality of photodetectors 104 are disposed within the semiconductor substrate 102. In some embodiments, the photodetectors 104 respectively extend from a back-side surface 102$bs$ of the semiconductor substrate 102 to a point below the back-side surface 102$bs$. In further embodiments, the point is at a front-side surface 102$fs$ of the semiconductor substrate 102, which is opposite the back-side surface 102$bs$ of the semiconductor substrate 102. An interconnect structure 205 is disposed along the front-side surface 102$fs$ of the semiconductor substrate 102. The interconnect structure 205 includes an interconnect dielectric structure 204, a plurality of conductive wires 206, and a plurality of conductive vias 208. The semiconductor substrate 102 is bonded to the carrier substrate 202 by way of the interconnect structure 205. In some embodiments, the conductive wires 206 and/or the conductive vias 208 respectively may, for example, be or comprise aluminum, copper, aluminum copper, tungsten, or the like. In some embodiments, the interconnect structure 205 may, for example, comprise one or more dielectric layers (e.g., silicon dioxide).

A stack of dielectric layers 108 overlies the back-side surface 102$bs$ of the semiconductor substrate 102. In some embodiments, the stack of dielectric layers 108 includes one or more dielectric layers, such as a first dielectric layer 108$a$, a second dielectric layer 108$b$, and a third dielectric layer 108$c$. In some embodiments, the first dielectric layer 108$a$ may, for example, be or comprise an oxide, a metal oxide, aluminum oxide, or the like and/or may have a thickness of 40 Angstroms or within a range of about 30-50 Angstroms. In some embodiments, the second dielectric layer 108b may, for example, be or comprise an oxide, a metal oxide, hafnium oxide, or the like and/or may have a thickness of 60 Angstroms or within a range of about 50-70 Angstroms. In further embodiments, the third dielectric layer 108c may, for example, be or comprise an oxide, a metal oxide, tantalum oxide, or the like and/or may have a thickness of 520 Angstroms or within a range of about 470-570 Angstroms. The stack of dielectric layers 108 may be configured to protect the back-side surface 102bs of the semiconductor substrate 102. A first insulator layer 209 (e.g., silicon dioxide) overlies the stack of dielectric layers 108. In some embodiments, the first insulator layer 209 extends over the back-side surface 102bs to a sidewall of the semiconductor substrate 102. A bottom surface of the first insulator layer 209 may extend below the front-side surface 102fs of the semiconductor substrate 102 into the interconnect dielectric structure 204.

An etch stop layer 110 overlies the first insulator layer 209. In some embodiments, the etch stop layer 110 may, for example, be or comprise a nitride (e.g., silicon nitride ($Si_3N_4$)), a carbide (e.g., silicon carbide), or the like and/or may have a thickness of 1500 Angstroms or within a range of about 1000-1500 Angstroms. The etch stop layer 110 extends over an upper surface of the first insulator layer 209 to a point between the front-side surface 102fs and the back-side surface 102bs of the semiconductor substrate 102. A charge release layer 112 overlies the etch stop layer 110 and extends from over the semiconductor substrate 102 to a point between the front-side and back-side surfaces 102fs, 102bs of the semiconductor substrate 102. In some embodiments, the charge release layer 112 may, for example, be or comprise a conductive material, such as titanium nitride, tantalum nitride, titanium, or the like. A second insulator layer 210 overlies the charge release layer 112 and may, for example, be or comprise an oxide (e.g., silicon dioxide), or another suitable dielectric material. A first conductive contact 218 (in some embodiments, referred to as a ground contact) overlies an upper wire layer 206a of the plurality of conductive wires 206. In some embodiments, the first conductive contact 218 extends over the front-side surface 102fs of the semiconductor substrate 102 through the semiconductor substrate 102 to contact with the upper wire layer 206a. A second conductive contact 220 overlies the upper wire layer 206a and extends through the semiconductor substrate 102 to the upper wire layer 206a. In further embodiments, the first and/or second conductive contacts 218, 220 may, for example, be or comprise aluminum, copper, aluminum copper, tungsten, tantalum nitride, or the like. In some embodiments, the first and/or second conductive contacts 218, 220 may comprise a same material as the plurality of conductive wires 206 and/or the plurality of conductive vias 208. In yet further embodiments, the first and second conductive contacts 218, 220 comprises a different material than the charge release layer 112. In alternative embodiments, the first conductive contact 218 is laterally offset and/or electrically isolated from the second conductive contact 220. In further embodiments, a wafer acceptance test (WAT) is performed at the second conductive contact 220, in which a wafer prober (not shown) sends electrical test signals to devices (e.g., pixel transistors) (not shown) disposed on and/or within the semiconductor substrate 102. For example, the electrical test signals check the functionality of the aforementioned devices and identify devices that fail to meet design specifications.

The first insulator layer 209 may be configured to electrically isolate the semiconductor substrate 102 from conductive layers extending through the semiconductor substrate 102 to the interconnect structure 205. Thus, devices (e.g., the photodetectors 104) disposed within, over, and/or under the semiconductor substrate 102 are electrically isolated from conductive layers (e.g., the charge release layer 112, the first conductive contact 218, and/or the second conductive contact 220) extending through the back-side surface 102bs of the semiconductor substrate 102.

A dielectric metal protection layer 212 overlies the first and second conductive contacts 218, 220. A first grid dielectric layer 214 overlies the dielectric metal protection layer 212. A second grid dielectric layer 216 overlies the first grid dielectric layer 214. The first grid dielectric layer 214 may, for example, be or comprise an oxide, such as silicon dioxide and/or may have a thickness of 5600 Angstroms or within a range of about 5400-5800 Angstroms. The second grid dielectric layer 216 may, for example, be or comprise silicon-oxy-nitride, or the like, and/or may have a thickness of 1500 Angstroms or within a range of about 1300-1700 Angstroms. A bond structure 224 overlies the first conductive contact 218 and is configured to electrically couple the first conductive contact 218 to another integrated circuit (IC) (not shown) or some other external device. In some embodiments, the bond structure 224 is electrically coupled to ground. In some embodiments, the bond structure 224 includes a bond pad 226 contacting the first conductive contact 218. Further, a solder bump 228 may overlie the bond pad 226. In further embodiments, a bond wire (not shown) is electrically coupled to the bond pad 226 by way of the solder bump 228, wherein the bond wire directly contacts the solder bump 228. In yet further embodiments, a photoresist 242 overlies the first conductive contact 218 and may, for example, be a blue color photoresist configured as an alignment region for electrically coupling the bond structure 224 to the another IC. In such embodiments, an alignment mark (not shown) may underlie the photoresist 242.

A dielectric grid structure 114 is laterally offset from the bond structure 224. The dielectric grid structure 114 includes a segment of the first grid dielectric layer 214 and a segment of the second grid dielectric layer 216 in a region 222. The region 222 is laterally offset from the first conductive contact 218 and overlies the photodetectors 104. The dielectric grid structure 114 is laterally around and between the photodetectors 104 to define a plurality of color filter openings. A plurality of color filters 116 are arranged within the plurality of color filter openings and overlies a respective plurality of photodetectors 104. The charge release layer 112 is disposed between the dielectric grid structure 114 and the etch stop layer 110, such that the charge release layer 112 is laterally around and between the photodetectors 104. The color filters 116 extend from an upper surface of the dielectric grid structure 114, through the first and second grid dielectric layers 214, 216 and the charge release layer 112 to an upper surface of the etch stop layer 110. Thus, in some embodiments, the charge release layer 112 is discontinuous directly over each photodetector 104 and laterally surrounds the color filters 116.

The charge release layer 112 extends over an upper surface of the etch stop layer 110 to a sidewall 218sw of the first conductive contact 218. In some embodiments, a sidewall of the charge release layer 112 disposed between the front-side surface 102fs and the back-side surface 102bs directly contacts the sidewall 218sw of the first conductive contact 218. In further embodiments, the first conductive contact 218 is electrically coupled to ground (e.g., by way of the bond structure 224), such that the charge release layer 112 may remove a buildup of trapped charge carriers (e.g., electrons) in the dielectric grid structure 114 to ground. This, in part, increases a reliability and/or an accuracy of images produced from the image sensor 200a.

In some embodiments, the charge release layer 112 has a first thickness $t_1$ and a second thickness $t_2$. The first thickness $t_1$ is defined between the dielectric grid structure 114 and an upper surface of the etch stop layer 110 within the region 222. The second thickness $t_2$ is defined outside of the region 222 between the upper surface of the etch stop layer 110 and a lower surface of the second insulator layer 210. In further embodiments, the first thickness $t_1$ is less than the second thickness $t_2$ or the first thickness $t_1$ is approximately equal to the second thickness $t_2$. In some embodiments, the first thickness $t_1$ is less than the second thickness $t_2$ because of an over etch process performed on the charge release layer 112 during formation of the dielectric grid structure 114. The second thickness $t_2$ may, for example, be within a range of about 500-1,000 Angstroms. In some embodiments, if the second thickness $t_2$ is less than 500 Angstroms, then the charge release layer 112 may be removed in the region 222 during the over etch process, thereby decreasing a reliability and/or accuracy of the images produced from the image sensor 200a. In such embodiments, an ability of the charge release layer 112 to remove trapped charge carriers from the dielectric grid structure 114 may be reduced and/or eliminated. In further embodiments, if the second thickness $t_2$ is greater than 1,000 Angstroms, then a time and costs associated with forming the image sensor 200a will be increased. In some embodiments, a bottom surface of the charge release layer 112 is vertically above an upper surface 218us of the first conductive contact 218.

Figure 2B:
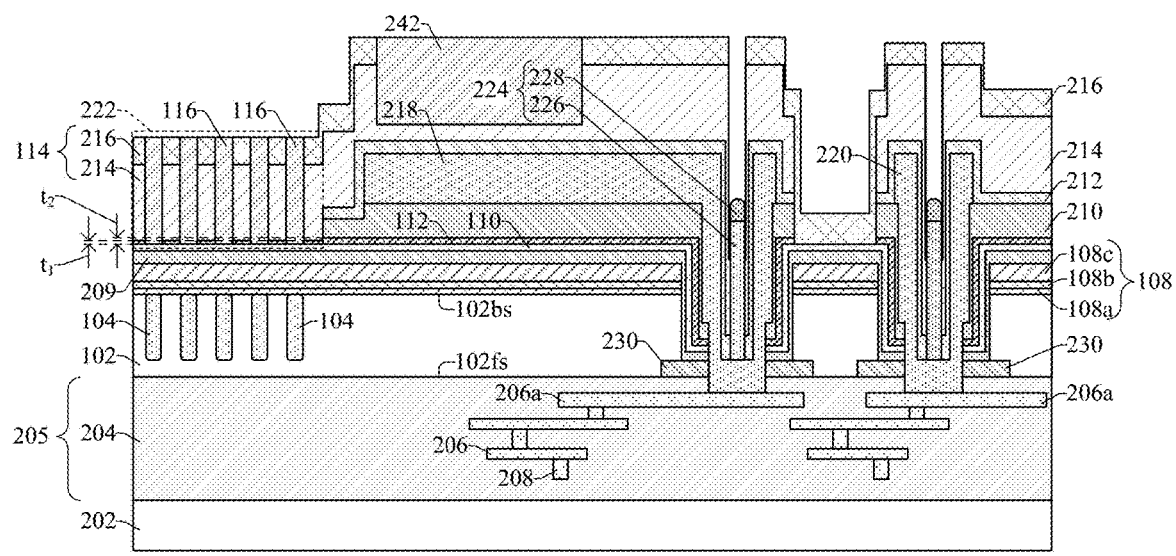

Referring to FIG. 2B, a cross-sectional view of an image sensor 200b in accordance with some alternative embodiments of the image sensor 100 of FIG. 1 is provided.

As illustrated in FIG. 2B, an isolation structure 230 is disposed within the semiconductor substrate 102. The first and second conductive contacts 218, 220 extend through the isolation structure 230 to contact the upper wire layer 206a. In some embodiments, the isolation structure 230 may be a dielectric material (e.g., silicon dioxide) and/or may be configured as a shallow trench isolation (STI) structure. A bottom surface of the first insulator layer 209 contacts an upper surface of the isolation structure 230. In further embodiments, a bottom surface of the isolation structure 230 contacts an upper surface of the interconnect dielectric structure 204. The isolation structure 230 is configured to further increase electrical isolation between conductive layer(s) and/or structure(s) (e.g., the first and second conductive contacts 218, 220 and/or the charge release layer 112) extending through the back-side surface 102bs of the semiconductor substrate 102 and devices (e.g., the photodetectors 104) disposed within and/or on the semiconductor substrate 102.

Figure 2C:
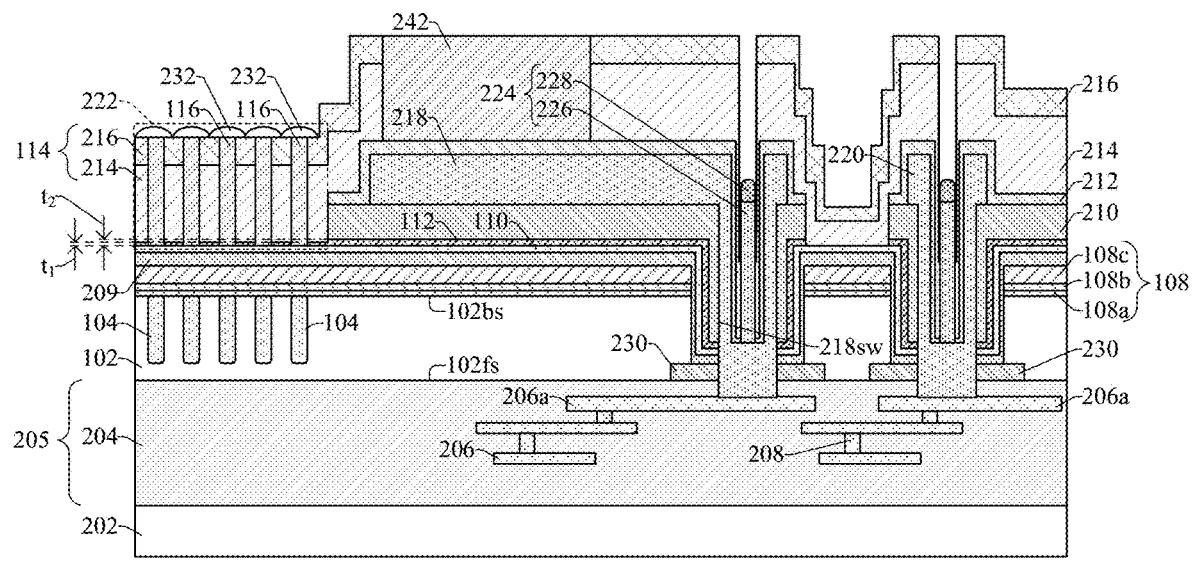

Referring to FIG. 2C, a cross-sectional view of an image sensor 200c in accordance with some alternative embodiments of the image sensor 100 of FIG. 1 is provided.

As illustrated in FIG. 2C, a plurality of micro-lenses 232 is disposed over the dielectric grid structure 114 in the region 222. The micro-lenses 232 respectively overlie corresponding photodetectors 104 and are respectively configured to focus electromagnetic radiation (e.g., photons) towards the corresponding photodetectors 104. Further, a sidewall 218sw of the first conductive contact 218 that extends through the semiconductor substrate 102 is substantially straight. For example, the sidewall 218sw may be disposed along a substantially vertical line that is orthogonal to the front-side surface 102fs of the semiconductor substrate 102. In some embodiments, a sidewall of the charge release layer 112 and/or a sidewall of the etch stop layer 110 directly contacts the sidewall 218sw.

Figure 2D:
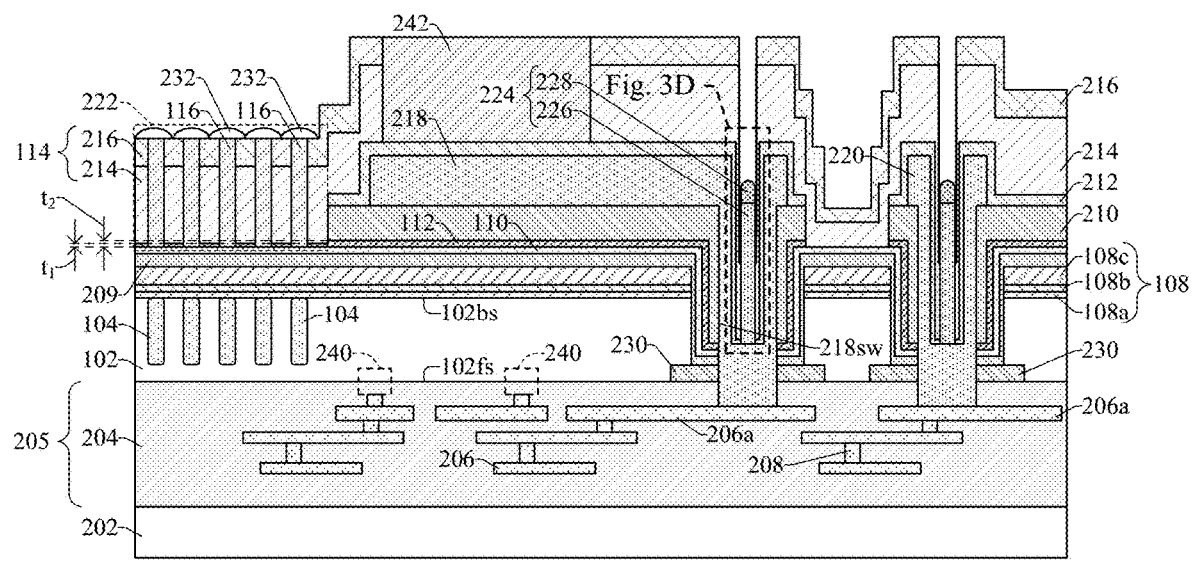

Referring to FIG. 2D, a cross-sectional view of an image sensor 200d in accordance with some alternative embodiments of the image sensor 100 of FIG. 1 is provided.

As illustrated in FIG. 2D, a plurality of semiconductor devices 240 may be disposed on and/or within the front-side surface 102fs of the semiconductor substrate 102. The plurality of semiconductor devices 240 are electrically coupled to the conductive wires 206 and the conductive vias 208. In some embodiments, the semiconductor devices 240 may, for example, be metal-oxide semiconductor field-effect transistors (MOSFETs). In such embodiments, the semiconductor devices 240 may correspond to pixel devices, such as source follower transistors, reset transistors, charge release transistors, etc.

Although FIGS. 2A, 2B, and 2C illustrate the semiconductor substrate 102 without the semiconductor devices 240 disposed on the front-side surface 102fs, it will be appreciated that the image sensors of FIGS. 2A, 2B, and 2C are not limited to such a configuration. Rather, in alternative embodiments, the image sensors of FIGS. 2A, 2B, and 2C may be configured as the image sensor 200d is illustrated and described in the cross-sectional view of FIG. 2D. For example, the semiconductor devices 240 may be disposed on the front-side surface 102fs of the semiconductor substrate 102 of FIGS. 2A, 2B, and 2C.

Figure 3A:
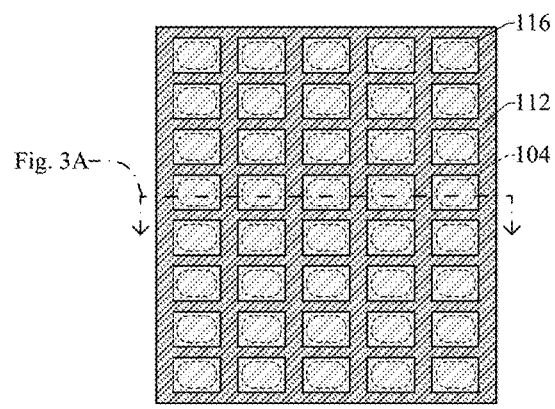
FIG. 3A illustrates a top view of some alternative embodiments of the charge release layer of FIG. 2A as indicated by the dashed line in FIG. 2A.

Referring to FIG. 3A, a top view 300a of some embodiments of the region 222 of FIG. 2A according to the dashed line in FIG. 2A is provided.

As illustrated in FIG. 3A, the plurality of photodetectors 104 are arranged in an array comprising rows and columns. Further, the color filters 116 are arrange in an array comprising rows and columns and respectively over the photodetector 104. In some embodiments, when viewed from above, the color filters 116 respectively have a rectangular/square shape and/or a circular/elliptical shape (not shown). The charge release layer 112 laterally surrounds the outer perimeter of each color filter 116, wherein the charge release layer 112 has inner sidewalls corresponding to a shape of each color filter 116. In some embodiments, the charge release layer 112 directly contacts outer sidewalls of each color filter 116. Further, the dielectric grid structure (114 of FIG. 2A) directly overlies the charge release layer 112 and has a same shape and/or layout as the charge release layer 112 when viewed from above (not shown).

Figure 3B:
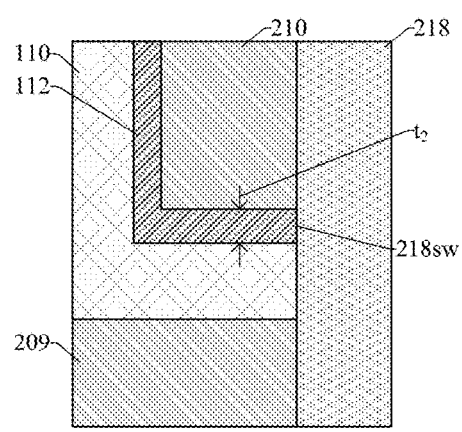
FIGS. 3B and 3C illustrate cross-sectional views of alternative embodiments of a section of the image sensor of FIG. 2A as indicated by the dashed box in FIG. 2A.

Referring to FIG. 3B, a cross-sectional view of some embodiments of a section of the image sensor 200a of FIG. 2A according to the dashed box in FIG. 2A is provided.

As illustrated in FIG. 3B, the charge release layer 112 extends along an upper surface of the etch stop layer 110 and contacts a sidewall 218sw of the first conductive contact 218. The charge release layer 112 includes a vertical segment overlying a horizontal segment, wherein a sidewall of the horizontal segment contacts the sidewall 218sw. In some embodiments, the vertical segment of the charge release layer 112 is separated from the first conductive contact 218 by the second insulator layer 210.

Figure 3C:
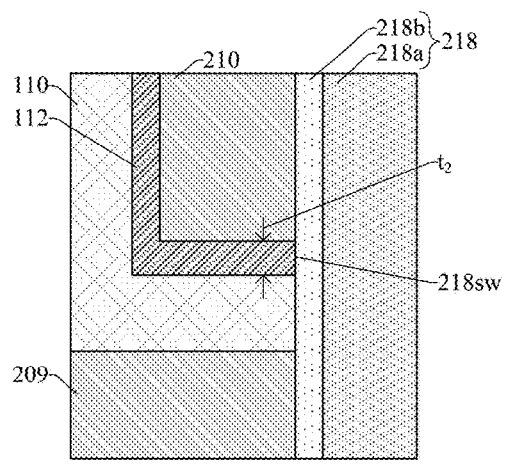

Referring to FIG. 3C, a cross-sectional view of some alternative embodiments of a section of the image sensor 200a of FIG. 2A according to the dashed box in FIG. 2A is provided.

As illustrated in FIG. 3C, the first conductive contact 218 includes a conductive body 218a surrounded by a conductive liner 218b. In some embodiments, the conductive body 218a comprises a first material and the conductive liner 218b comprises a second material different than the first material. In some embodiments, the first material may, for example, be or comprise aluminum, copper, aluminum copper, or the like and/or the second material may, for example, be or comprise tantalum nitride, or the like. In some embodiments, the charge release layer 112 comprises a same material as the conductive liner 218b (e.g., tantalum nitride). In further embodiments, the charge release layer 112 directly contacts the conductive liner 218b and is electrically coupled to the conductive body 218a by way of the conductive liner 218b.

Figure 3D:
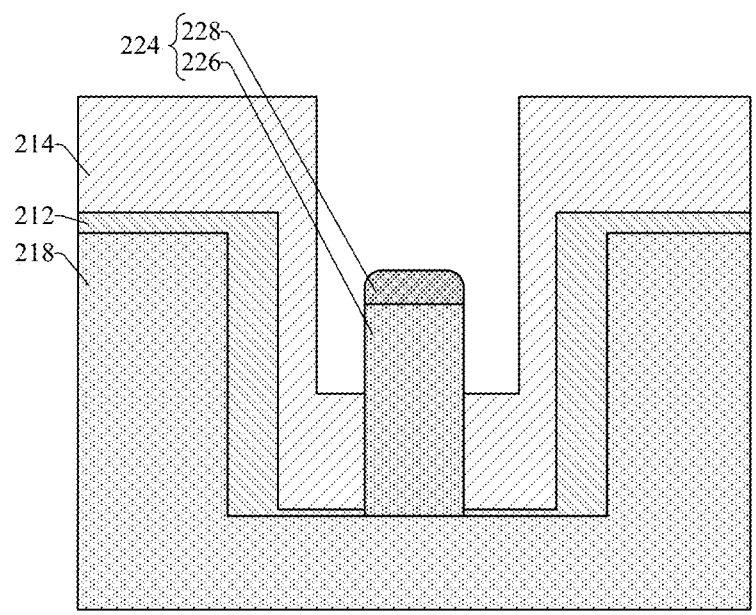
FIG. 3D illustrates a cross-sectional view of alternative embodiments of a section of the image sensor of FIG. 2D as indicated by the dashed box in FIG. 2D.

Referring to FIG. 3D, a cross-sectional view of some alternative embodiments of a section of the image sensor 200d of FIG. 2D according to the dashed box in FIG. 2D is provided.

As illustrated in FIG. 3D, the bond structure 224 may be laterally offset from sidewalls of the first conductive contact 218, sidewalls of the dielectric metal protection layer 212, and/or sidewalls of the first grid dielectric layer 214. Further, an upper surface of the bond structure 224 may be vertically below a top surface of the first conductive contact 218.

Figure 3E:
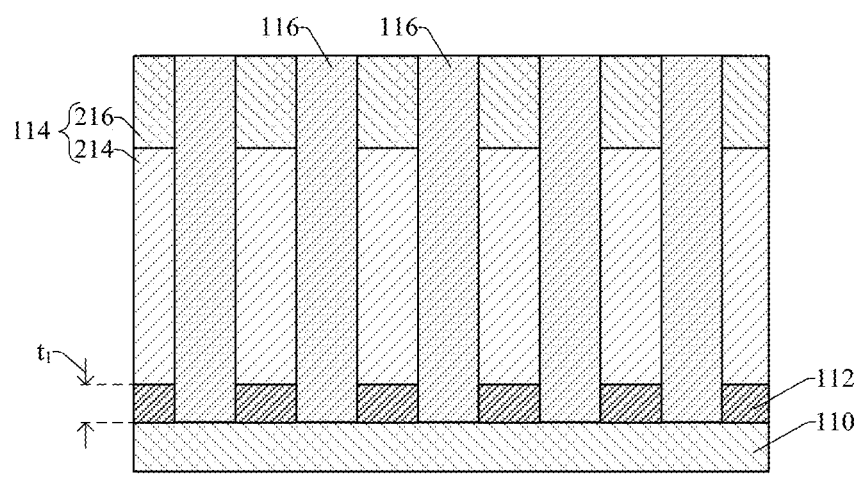
FIG. 3E illustrates a cross-sectional view of alternative embodiments of a section of the image sensor of FIG. 2A as indicated by the dashed box in FIG. 2A.

Referring to FIG. 3E, a cross-sectional view of some alternative embodiments of the region 222 of the image sensor 200a of FIG. 2A according to the dashed box in FIG. 2A is provided. As illustrated in FIG. 3E, the charge release layer 112 is disposed between the dielectric grid structure 114 and the etch stop layer 110. In some embodiments, the charge release layer 112 and/or the dielectric grid structure 114 in the region 222 each comprise the sidewall profiles as illustrated and/or described in FIG. 14B.

FIGS. 4-15 illustrate cross-sectional views 400-1500 of some embodiments of a method of forming an image sensor including a charge release layer according to aspects of the present disclosure. Although the cross-sectional views 400-1500 shown in FIGS. 4-15 are described with reference to a method, it will be appreciated that the structures shown in FIGS. 4-15 are not limited to the method but rather may stand alone separate of the method. Although FIGS. 4-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 4-15 may, for example, be employed to form the image sensor 200c of FIG. 2C.

Figure 4:
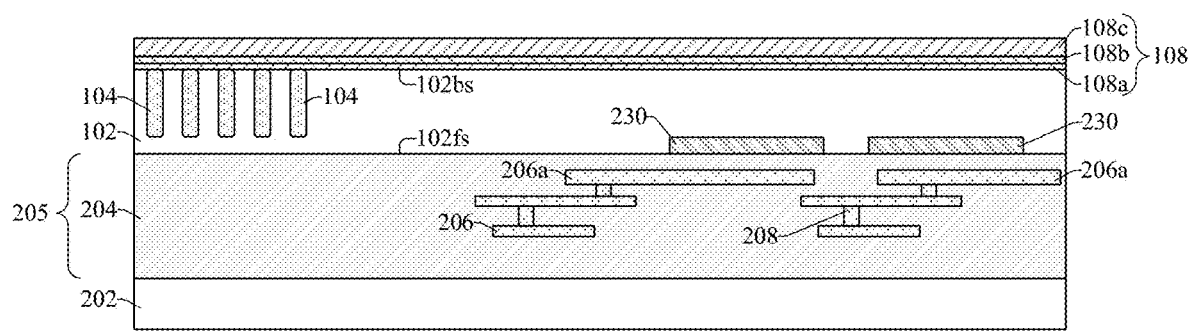
FIGS. 4-15 illustrate a series of cross-sectional views of some embodiments of a method for forming an image sensor including a charge release layer disposed around a plurality of color filters.

As shown in cross-sectional view 400 of FIG. 4, a semiconductor substrate 102 is provided and is bonded to a carrier substrate 202 by way of an interconnect structure 205. Before performing the bonding process, the substrate 102 is rotated 180 degrees, wherein a front-side surface 102fs of the semiconductor substrate 102 is above a back-side surface 102bs of the semiconductor substrate 102. An isolation structure 230 is formed on the front-side surface 102fs of the semiconductor substrate 102. In some embodiments, the semiconductor substrate 102 may, for example, be a bulk substrate (e.g., a bulk silicon substrate), a silicon-on-insulator (SOI) substrate, or some other suitable substrate. In some embodiments, before forming the isolation structure 230, an implant process is performed to dope the semiconductor substrate 102 with a first doping type (e.g., p-type). In some embodiments, a process for forming the isolation structure 230 may include: 1) selectively etching the semiconductor substrate 102 to form a trench in the semiconductor substrate 102 that extends into the semiconductor substrate 102 from the front-side surface 102fs; and 2) filling (e.g., by chemical vapor deposition (CVD), physical vapor deposition (PVD), atomic layer deposition (ALD), thermal oxidation, etc.) the trench with a dielectric material (e.g., silicon dioxide). A plurality of photodetectors 104 are formed in the semiconductor substrate 102. The photodetectors 104 are respectively a region of the semiconductor substrate 102 comprising a second doping type (e.g., n-type) opposite the first doping type. In some embodiments, the photodetectors 104 may be formed by a selective ion implantation process that utilizes a masking layer (not shown) on the front-side surface 102fs of the semiconductor substrate 102 to selectively implant ions into the semiconductor substrate 102.

Also shown in cross-sectional view 400 of FIG. 4, the interconnect structure 205 is formed over the front-side surface 102fs of the semiconductor substrate 102. The interconnect structure 205 includes an interconnect dielectric structure 204, a plurality of conductive wires 206, and a plurality of conductive vias 208. In some embodiments, the interconnect dielectric structure 204 may be or comprise one or more inter-level dielectric (ILD) layers. The one or more ILD layers may, for example, be or comprise an oxide, such as silicon dioxide, or another suitable oxide. In some embodiments, a process for forming the interconnect structure 205 includes forming the conductive vias 208 and the conductive wires 206 by a single damascene process or a dual damascene process. For example, a first layer of the conductive vias 208 and a first layer of the conductive wires 206 may respectively be formed by a single damascene process. Further, the process includes forming remaining layers of the conductive wires 206 and the conductive vias 208 by repeatedly performing a dual damascene process.

In some embodiments, the single damascene process includes: 1) depositing a dielectric layer; 2) patterning the dielectric layer with openings for a single layer of conductive features (e.g., a layer of vias or wires); and 3) filling the openings with conductive material (e.g., aluminum, copper, aluminum copper, etc.) to form the single layer of conductive features. The dielectric layer may, for example, correspond to the one or more ILD layers in the interconnect dielectric structure 204. In some embodiments, the dual damascene process includes: 1) depositing a dielectric layer; 2) patterning the dielectric layer with openings for two layers of conductive features (e.g., a layer of vias and a layer of wires); and 3) filling the openings with conductive material (e.g., aluminum, copper, aluminum copper, etc.) to form the two layers of conductive features. In some embodiments, after filling the openings with conductive materials a planarization process (e.g., a chemical-mechanical polishing (CMP)) may be performed on the conductive materials until an upper surface of the dielectric layer is reached. In some embodiments, the conductive wires 206 and/or the conductive vias 208 may respectively, for example, be or comprise aluminum, copper, aluminum copper, or the like.

Further, as shown in cross-sectional view 400 of FIG. 4, the semiconductor substrate 102 is orientated such that the front-side surface 102fs is below the back-side surface 102bs and the interconnect structure 205 is bonded to the carrier substrate 202. In some embodiments, the bonding process may, for example, be a fusion bonding process, or another suitable bonding process. A stack of dielectric layers 108 may be formed over a back-side surface 102bs of the semiconductor substrate 102. The back-side surface 102bs is opposite the front-side surface 102fs. In some embodiments, the stack of dielectric layers 108 include a first dielectric layer 108a, a second dielectric layer 108b, and a third dielectric layer 108c. In some embodiments, the first dielectric layer 108a, the second dielectric layer 108b, and/or the third dielectric layer 108c may respectively be formed by CVD, PVD, ALD, thermal oxidation, or another suitable deposition process. In further embodiments, the first, second, and third dielectric layers 108a-c may each comprise a different dielectric material from one another. For example, the first dielectric layer 108a may comprise aluminum oxide, the second dielectric layer 108b may comprise hafnium oxide, and the third dielectric layer 108c may comprise tantalum oxide.

Figure 5:
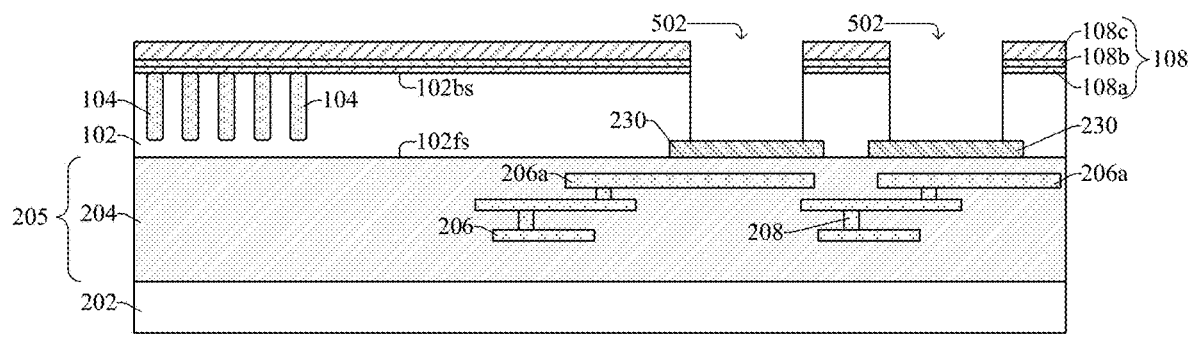

As shown in cross-sectional view 500 of FIG. 5, a first etch process is performed on the stack of dielectric layers 108 and the semiconductor substrate 102, thereby defining first openings 502. The first etch process exposes an upper surface of the isolation structure 230. In some embodiments, the first etch process includes: 1) forming a masking layer (not shown) over the stack of dielectric layers 108; 2) exposing unmasked regions of the stack of dielectric layers 108 and the semiconductor substrate 102 to one or more etchants; and 3) performing a removal process to remove the masking layer. In some embodiments, the first etch process may include a wet etch process, a dry etch process, or another suitable etch process.

Figure 6:
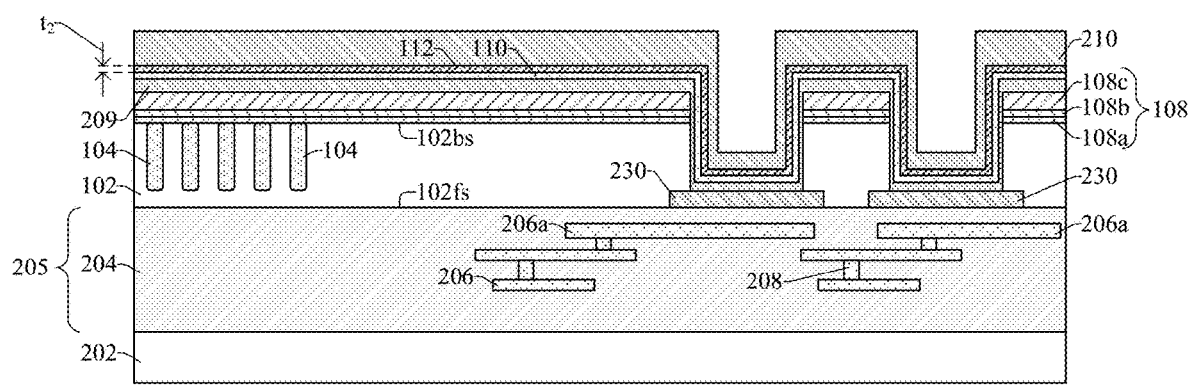

As shown in cross-sectional view 600 of FIG. 6, a first insulator layer 209 is formed over the stack of dielectric layers 108 and lines the first openings (502 of FIG. 5). An etch stop layer 110 is formed over an upper surface of the first insulator layer 209. A charge release layer 112 is formed over an upper surface of the etch stop layer 110, and a second insulator layer 210 is formed over an upper surface of the charge release layer 112. In some embodiments, the first and second insulator layers 209, 210, the etch stop layer 110, and/or the charge release layer 112 may respectively be formed by CVD, PVD, ALD, or another suitable deposition process. In some embodiments, the charge release layer 112 may, for example, be or comprise a conductive material, such as titanium nitride, tantalum nitride, titanium, tantalum, or the like. In some embodiments, the charge release layer 112 may be formed to have a second thickness $t_2$ that may, for example, be within a range of about 500-1,000 Angstroms.

Figure 7:
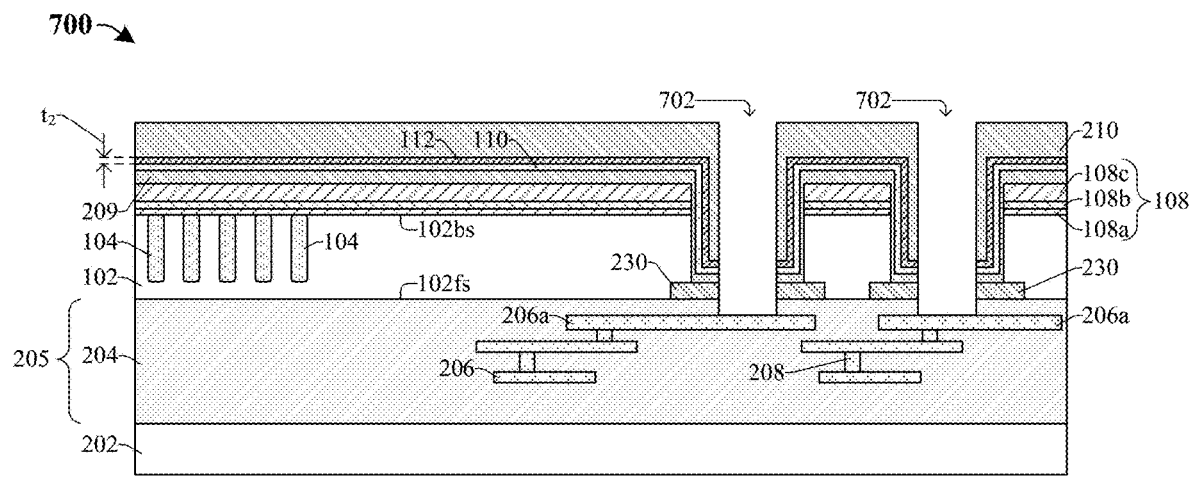

As shown in cross-sectional view 700 of FIG. 7, a second etch process is performed on the structure of FIG. 6, thereby defining contact openings 702. The second etch process exposes an upper surface of an upper wire layer 206a of the plurality of conductive wires 206. In some embodiments, the second etch process includes: 1) forming a masking layer (not shown) over the second insulator layer 210; 2) exposing unmasked regions of the second insulator layer 210 and respective underlying layers to one or more etchants until the upper surface of the upper wire layer 206a is reached; and 3) performing a removal process to remove the masking layer. In some embodiments, the second etch process may include a wet etch process, a dry etch process, or another suitable etch process.

Figure 8:
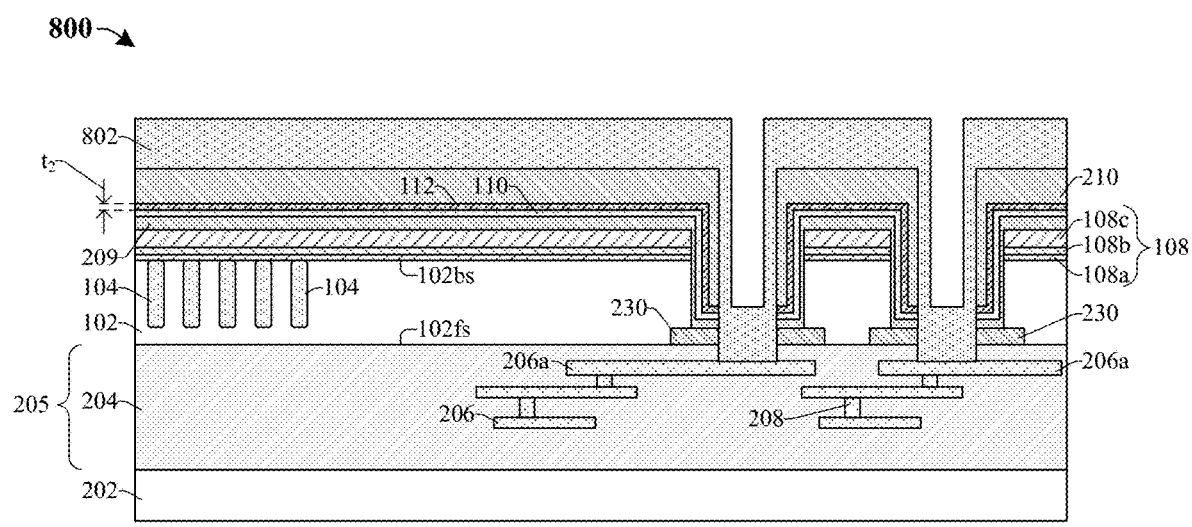

As shown in cross-sectional view 800 of FIG. 8, a conductive contact layer 802 is formed over an upper surface of the second insulator layer 210 and at least partially fills the contact openings (702 of FIG. 7). In some embodiments, the conductive contact layer 802 may, for example, be or comprise aluminum, copper, aluminum copper, tantalum nitride, or the like. In some embodiments, the conductive contact layer 802 may comprise a conductive body (not shown) overlying a conductive liner (not shown) (e.g., 218a and 218b of FIG. 3C), wherein the conductive body is separated from the second insulator layer 210 by the conductive liner. In further embodiments, the conductive contact layer 802 may, for example, be formed by PVD, CVD, electroless plating, sputtering, electroplating, or another suitable deposition process. In yet further embodiments, the conductive contact layer 802 is formed in such a manner that the charge release layer 112 directly contacts and/or is electrically coupled to the conductive contact layer 802.

Figure 9:
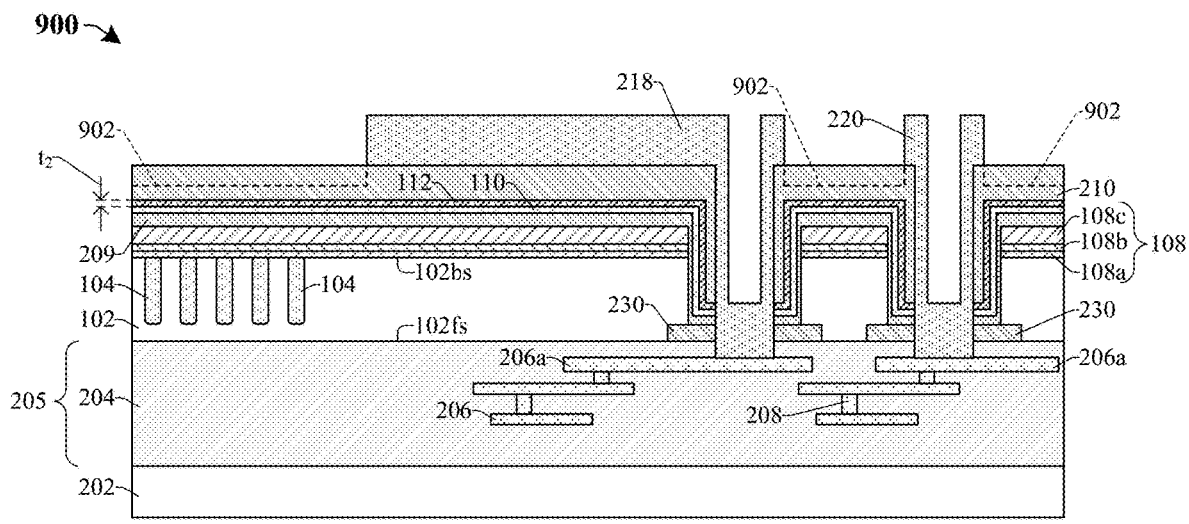

As shown in cross-sectional view 900 of FIG. 9, a third etch process is performed on the conductive contact layer (802 of FIG. 8), thereby defining a first conductive contact 218 and a second conductive contact 220. In some embodiments, the third etch process is performed in such a manner that the first conductive contact 218 is laterally separated from the second conductive contact 220 by a non-zero distance, wherein the first and second conductive contacts 218, 220 do not contact one another. In some embodiments, the third etch process includes: 1) forming a masking layer (not shown) over the conductive contact layer (802 of FIG. 8); 2) exposing unmasked regions of the conductive contact layer (802 of FIG. 8) to one or more etchants; and 3) performing a removal process to remove the masking layer. In some embodiments, the third etch process may include performing a wet etch process, a dry etch process, or another suitable etch process. In further embodiments, the third etch process may over etch and remove portions of the second insulator layer 210 as illustrated by the dashed lines 902 in FIG. 9.

Figure 10:
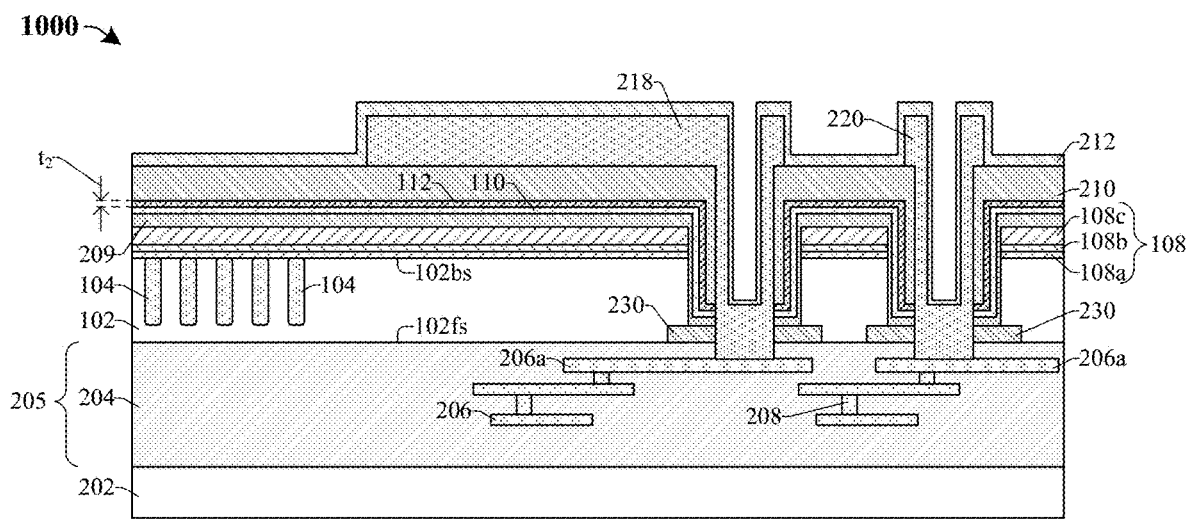

As shown in cross-sectional view 1000 of FIG. 10, a dielectric metal protection layer 212 is formed over the first and second conductive contacts 218, 220 and the second insulator layer 210. In some embodiments, the dielectric metal protection layer 212 is configured to protect a top surface of the first conductive contact 218 and a top surface of the second conductive contact 220 during subsequent processing steps.

Figure 11:
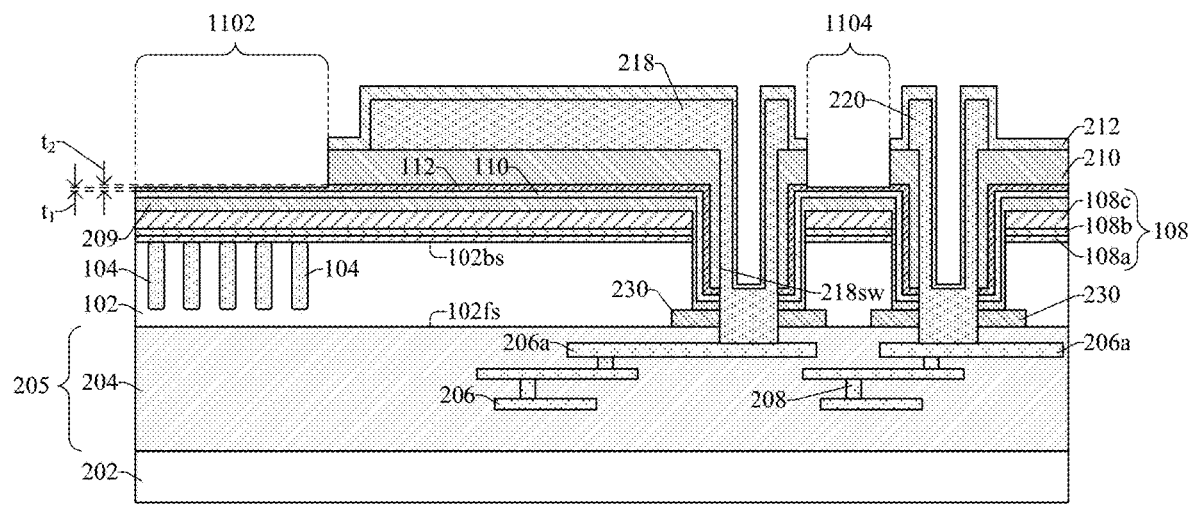

As shown in cross-sectional view 1100 of FIG. 11, a fourth etch process is performed on the structure of FIG. 10, thereby removing the dielectric metal protection layer 212 and the second insulator layer 210 from a first region 1102 and a second region 1104. The first region 1102 overlies the plurality of photodetectors 104 and the second region 1104 is laterally between the first and second conductive contacts 218, 220. In some embodiments, the fourth etch process includes: 1) forming a masking layer (not shown) over the dielectric metal protection layer 212; 2) exposing unmasked regions of the dielectric metal protection layer 212 and the second insulator layer 210 to one or more etchants; and 3) performing a removal process to remove the masking layer. In some embodiments, the fourth etch process may include performing a wet etch, a dry etch, or another suitable etch process. Further, in some embodiments, the fourth etch process may over etch and remove a portion of the charge release layer 112 in the first and second regions 1102, 1104, wherein the charge release layer 112 has a first thickness $t_1$ in the first and second regions 1102, 1104. In some embodiments, the first thickness $t_1$ is less than the second thickness $t_2$.

Figure 12:
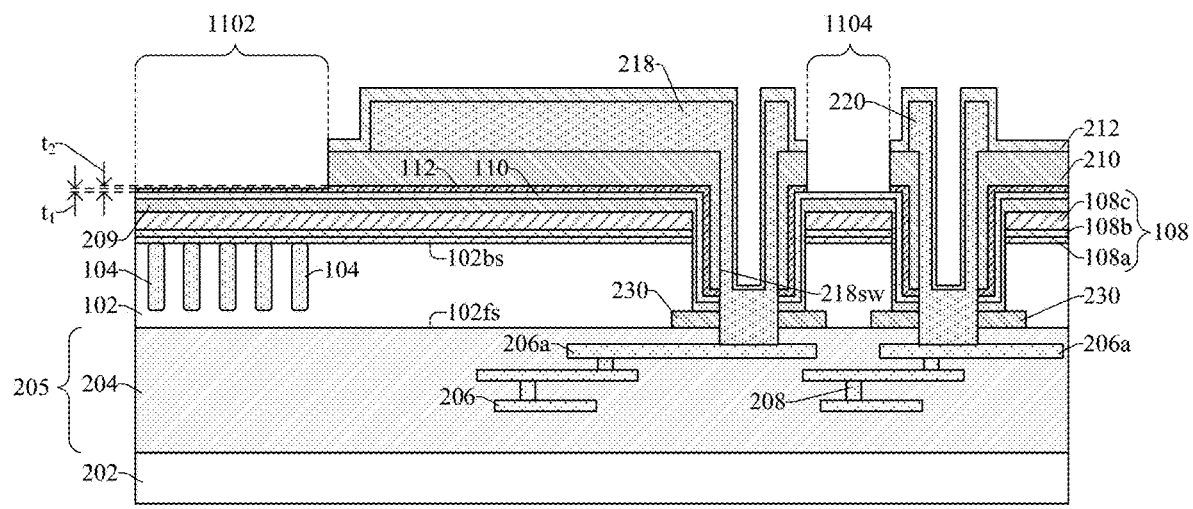

As shown in cross-sectional view 1200 of FIG. 12, a fifth etch process is performed on the charge release layer 112 in the second region 1104, thereby electrically isolating the first conductive contact 218 from the second conductive contact 220. In some embodiments, the fifth etch process includes: 1) forming a masking layer (not shown) over the charge release layer 112 and the dielectric metal protection layer 212; 2) exposing unmasked regions of the charge release layer 112 to one or more etchants until an upper surface of the etch stop layer 110 is reached; and 3) performing a removal process to remove the masking layer. In some embodiments, the fifth etch process may include performing a wet etch, a dry etch, or another suitable etch process. In further embodiments, the fifth etch process completely removes the charge release layer 112 from the second region 1104.

Figure 13:
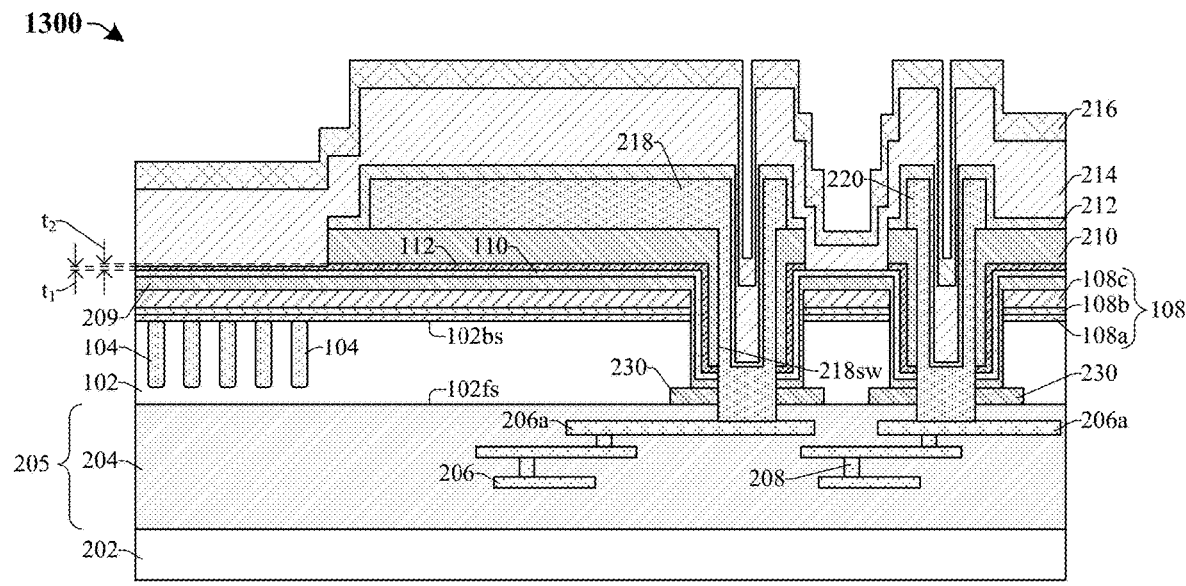

As shown in cross-sectional view 1300 of FIG. 13, a first grid dielectric layer 214 is formed over the structure of FIG. 12. A second grid dielectric layer 216 is formed over the first grid dielectric layer 214. In some embodiments, the first grid dielectric layer 214 comprises a first dielectric material (e.g., silicon dioxide) and the second grid dielectric layer 216 comprises a second dielectric material (e.g., silicon-oxynitride) different than the first dielectric material. In some embodiments, the first and/or second grid dielectric layers 214, 216 may respectively be formed by CVD, PVD, ALD, or another suitable deposition process.

Figure 14A:
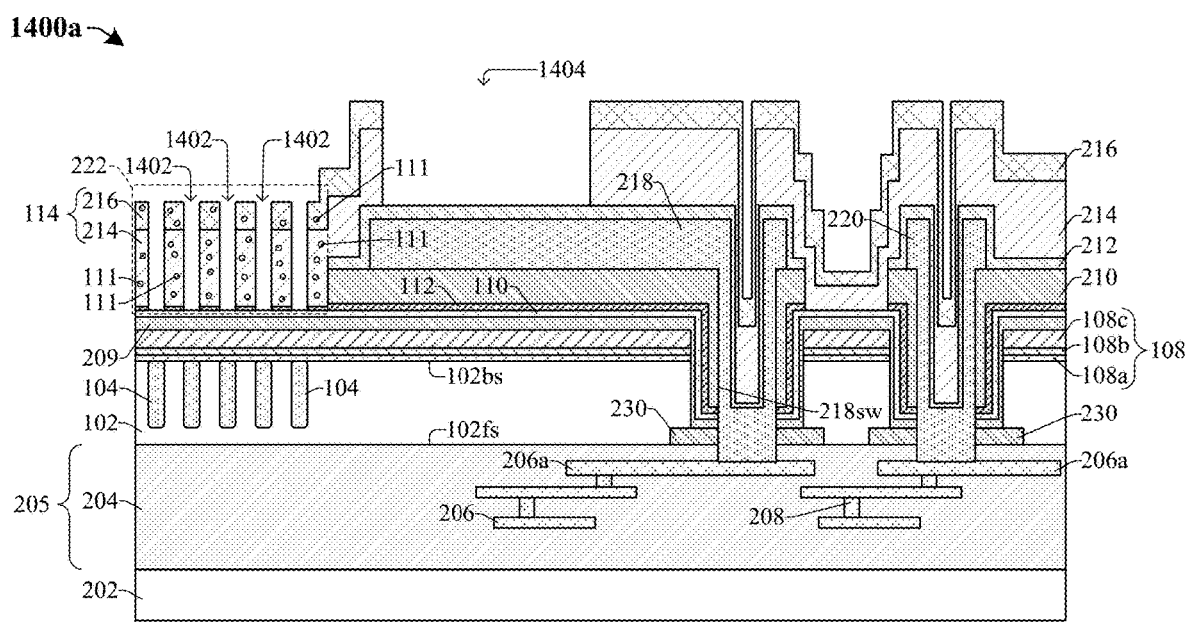

As shown in cross-sectional view 1400A of FIG. 14A, a sixth etch process is performed on the first and second grid dielectric layers 214, 216 and the charge release layer 112. This defines a plurality of color filter openings 1402 over the photodetectors 104 and a photoresist opening 1404 over the first conductive contact 218. The sixth etch process stops on the etch stop layer 110, such that the etch stop layer 110 serves as an etch stop for the sixth etch process. In some embodiments, the sixth etch process includes: 1) forming a masking layer (not shown) over the second grid dielectric layer 216; 2) exposing unmasked regions of the first and second grid dielectric layers 214, 216 and the charge release layer 112 to one or more etchants; and 3) performing a removal process to remove the masking layer. In some embodiments the sixth etch process may include performing a wet etch, a dry etch, or another suitable etch process. In some embodiments, the sixth etch process removes a portion of the charge release layer 112 overlying each photodetector 104, thereby exposing an upper surface of the etch stop layer 110. Thus, in such embodiments, the charge release layer 112 has a layout as described and illustrated in the top view 300a of FIG. 3A.

Further, the sixth etch process defines a dielectric grid structure 114 in a region 222 overlying the photodetectors 104. The dielectric grid structure 114 includes a segment of the first grid dielectric layer 214 and a segment of the second grid dielectric layer 216 in the region 222. In some embodiments, the sixth etch process may include performing a dry etch and/or a plasma etch that may deposit charge carriers 111 (e.g., electrons) in the dielectric grid structure 114.

Figure 14B:
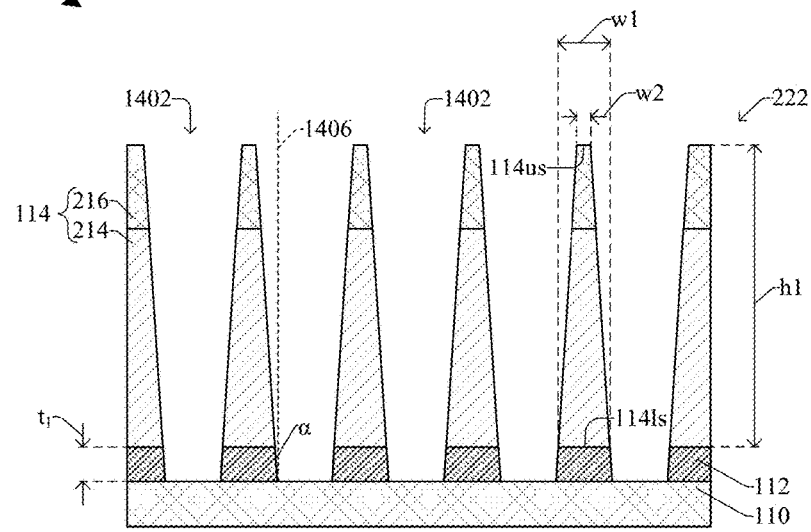

FIG. 14B illustrates a cross-sectional view 1400b of some alternative embodiments of a close-up of the region 222 of FIG. 14A. In some embodiments, FIG. 14B illustrates the region 222 after performing the sixth etch process. In such embodiments, the charge carriers (111 of FIG. 14A) are omitted from the cross-sectional view 1400b for ease of illustration.

The dielectric grid structure 114 and the charge release layer 112 each may have slanted sidewalls that define the color filter openings 1402. In some embodiments, an angle α is defined between a sidewall of the charge release layer 112 and a substantially straight line 1406. The substantially straight line 1406 may be perpendicular to a bottom surface of the charge release layer 112 and/or a top surface of the etch stop layer 110. Further, the substantially straight line 1406 is adjacent to the sidewall of the charge release layer 112. In some embodiments, the angle α may, for example, be within a range of about 1 to 5 degrees. In further embodiments, a grid structure angle may be defined between a sidewall of the dielectric grid structure 114 and a substantially straight line adjacent to the dielectric grid structure 114. The grid structure angle may be within a range of 1 to 15 degrees.

In some embodiments, a lower surface 114ls of the dielectric grid structure 114 has a first width w1 and an upper surface 114us of the dielectric grid structure 114 has a second width w2. In some embodiments, the first width w1 is within a range of about 250 to 490 nanometers. In further embodiments, the second width w2 is within a range of about 200 to 400 nanometers. In such embodiments, a difference between the first width w1 and the second width w2 is within a range of about 50 to 90 nanometers. Further, a height h1 of the dielectric grid structure 114 may be within a range of about 600 to 800 nanometers.

Figure 15:
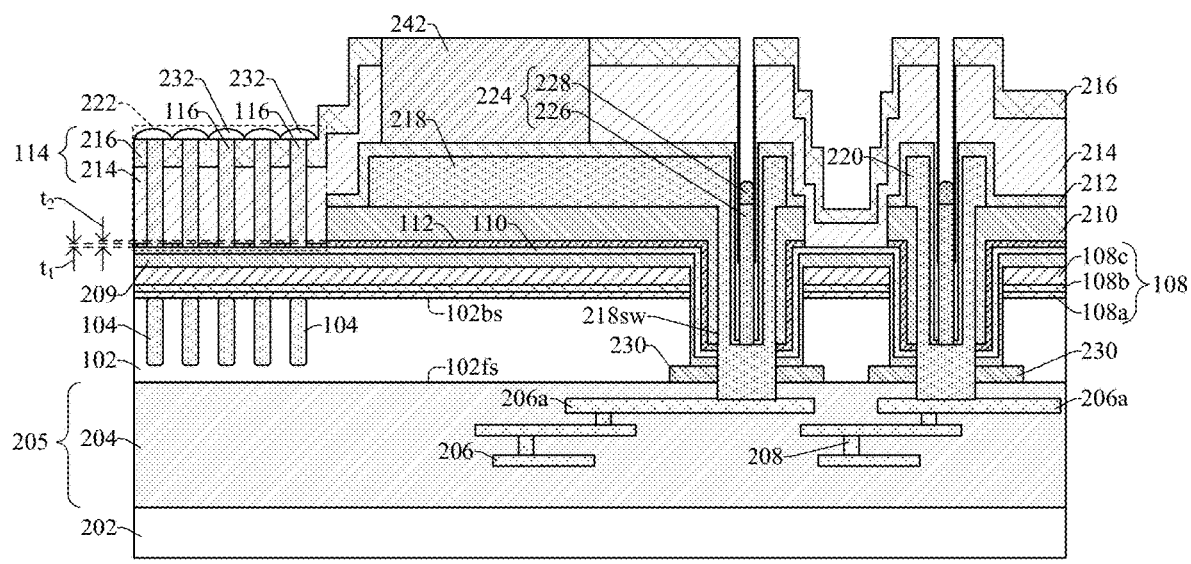

As shown in cross-sectional view 1500 of FIG. 15, a plurality of color filters 116 is formed in the plurality of color filter openings (1402 of FIG. 14A), wherein the color filters 116 respectively overlie a corresponding photodetector 104. The color filters 116 may be formed by CVD, PVD, ALD, or another suitable deposition process. Further, a photoresist 242 is formed in the photoresist opening (1404 of FIG. 14A) and may, for example, be a blue color photoresist configured as an alignment region. In such embodiments, an alignment mark (not shown) may underlie the photoresist 242 and/or be disposed on the photoresist 242. Furthermore, a bond structure 224 is formed over the first conductive contact 218, wherein the bond structure 224 includes a solder bump 228 overlying a bond pad 226. In some embodiments, a process for forming the bond structure 224 may include: 1) patterning the first and second grid dielectric layers 214, 216, and the dielectric metal protection layer 212 to expose a top surface of the first conductive contact 218; 2) selectively forming the bond pad 226 over the first conductive contact 218, wherein, in some embodiments, sidewalls of the bond pad 226 are laterally offset from sidewalls of the first and second grid dielectric layers 214, 216 by a non-zero distance; and 3) forming the solder bump 228 over the bond pad 226. In some embodiments, step 2) in the aforementioned process may be achieved by forming the bond pad 226 over the first conductive contact 218 and subsequently selectively etching the bond pad 226 by a masking layer (not shown). In some embodiments, the dielectric grid structure 114 and the charge release layer 112 may each comprise slanted sidewalls as illustrated and/or described in cross-sectional view 1400b of FIG. 14B.

Furthermore, as shown in FIG. 15, a plurality of micro-lenses 232 is formed over the plurality of color filters 116. The micro-lenses 232 may be formed by depositing a micro-lens material on the color filters 116 (e.g., by a spin-on method or a deposition process). A micro-lens template (not shown) having a curved upper surface is patterned above the micro-lens material. The micro-lenses are then formed by selectively etching the micro-lens material according to the micro-lens template.

In some embodiments, after forming the color filters 116, the charge release layer 112 is electrically coupled to ground, such that the charge carriers (111 of FIG. 14A) may be removed from the dielectric grid structure 114. This, in part, increases a reliability and/or an accuracy of images produced from the photodetectors 104, and/or removes a gray color from dark images (e.g., black images) produced from the photodetectors 104. The charge release layer 112 may be electrically coupled to ground by way of the first conductive contact 218 and/or the bond structure 224. In some embodiments, the charge release layer 112 is electrically coupled to ground after forming the bond structure 224.

Figure 16:
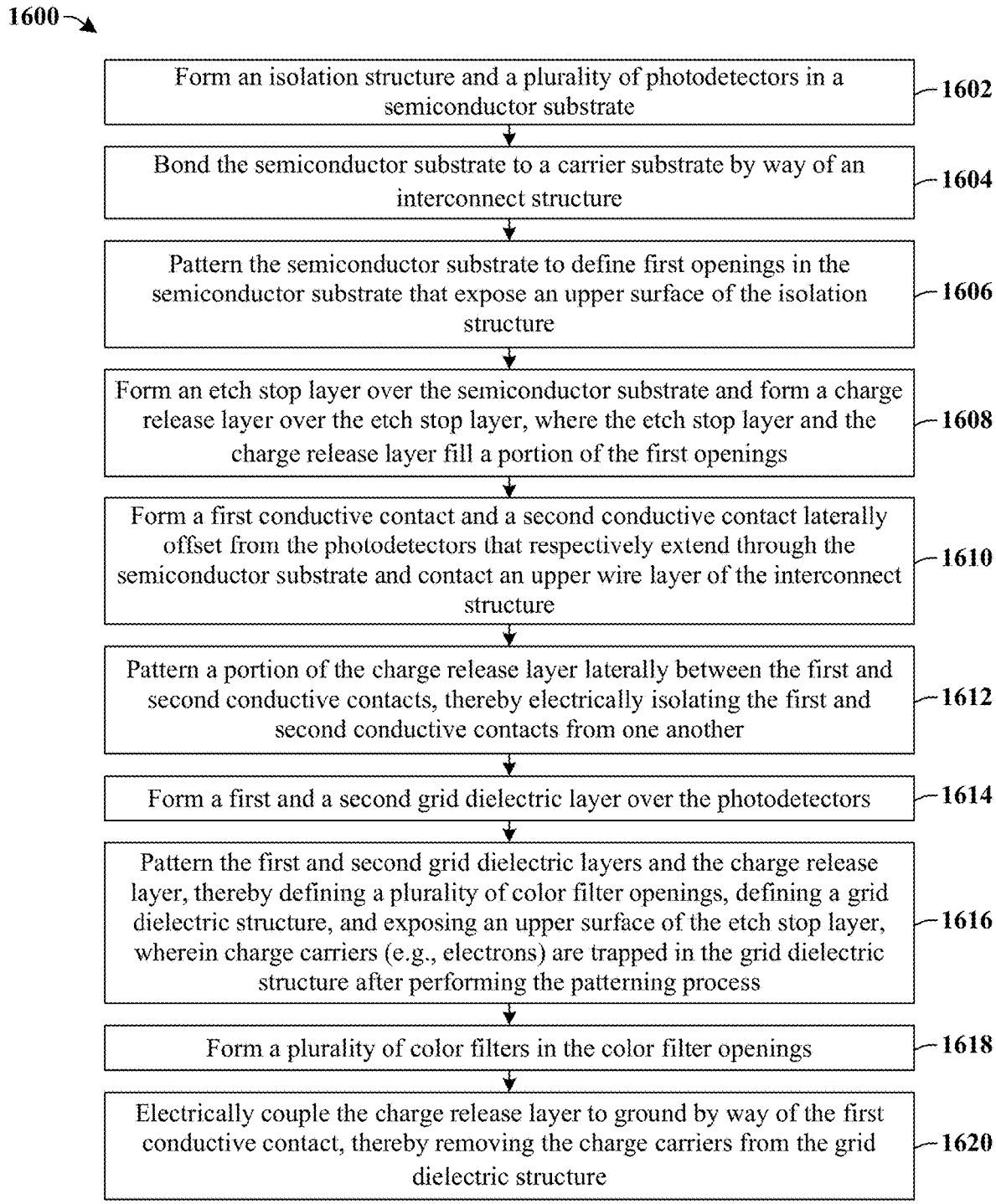
FIG. 16 illustrates a block diagram of some embodiments of the method of FIGS. 4-15.

FIG. 16 illustrates a method 1600 of forming an image sensor according to the present disclosure. Although the method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, an isolation structure and a plurality of photodetectors are formed in a semiconductor substrate. FIG. 4 illustrates a cross-sectional view 400 corresponding to some embodiments of act 1602.

At act 1604, the semiconductor substrate is bonded to a carrier substrate by way of an interconnect structure. FIG. 4 illustrates a cross-sectional view 400 corresponding to some embodiments of act 1604.

At act 1606, the semiconductor substrate is patterned to define first openings in the semiconductor substrate, thereby exposing an upper surface of the isolation structure. FIG. 5 illustrates a cross-sectional view 500 corresponding to some embodiments of act 1606.

At act 1608, an etch stop layer is formed over the semiconductor substrate and a charge release layer is formed over the etch stop layer. The etch stop layer and the charge release layer fill a portion of the first openings. FIG. 6 illustrates a cross-sectional view 600 corresponding to some embodiments of act 1608.

At act 1610, a first conductive contact and a second conductive contact are formed laterally offset from the photodetectors. The first and second conductive contacts respectively extend through the semiconductor substrate and contact an upper wire layer of the interconnect structure. FIGS. 7-9 illustrate cross-sectional views 700-900 corresponding to some embodiments of act 1610.

At act 1612, a portion of the charge release layer laterally between the first and second conductive contacts is patterned. Thus, the first conductive contact is electrically isolated from the second conductive contact. FIG. 12 illustrates a cross-sectional view 1200 corresponding to some embodiments of the act 1612.

At act 1614, first and second grid dielectric layers are formed over the photodetectors. FIG. 13 illustrates a cross-sectional view 1300 corresponding to some embodiments of act 1614.

At act 1616, the first and second grid dielectric layers and the charge release layer are patterned. This defines a plurality of color filter openings, defines a grid dielectric structure, and exposes an upper surface of the etch stop layer. Charge carriers (e.g., electrons) are trapped in the grid dielectric structure after performing the patterning process. FIG. 14A illustrates a cross-sectional view 1400A corresponding to some embodiments of act 1616.

At act 1618, a plurality of color filters is formed in the color filter openings. FIG. 15 illustrates a cross-sectional view 1500 corresponding to some embodiments of act 1618.

At act 1620, the charge release layer is electrically coupled to ground by way of the first conductive contact, thereby removing the charge carriers from the grid dielectric structure. FIG. 15 illustrates a cross-sectional view 1500 corresponding to some embodiments of act 1620.

Accordingly, in some embodiments, the present disclosure relates to an image sensor including a charge release layer disposed between a dielectric grid structure and a plurality of photodetectors. The charge release layer is electrically coupled to ground and is configured to remove trapped charge carriers (e.g., electrons) from the dielectric grid structure.

In some embodiments, the present application provides an image sensor including a semiconductor substrate; a photodetector disposed within the semiconductor substrate; an etch stop layer overlying the photodetector; a color filter overlying the etch stop layer; a dielectric grid structure surrounding the color filter; and a charge release layer sandwiched between the dielectric grid structure and the etch stop layer, wherein the charge release layer surrounds the color filter and comprises a conductive material, and wherein the charge release layer directly contacts the color filter.

In some embodiments, the present application provides a semiconductor structure for an image sensor including an integrated circuit including a carrier substrate, a semiconductor substrate, and an interconnect structure, wherein the interconnect structure is disposed between the semiconductor substrate and the carrier substrate, and wherein photodetectors are disposed in the semiconductor substrate; a dielectric grid structure overlying the semiconductor substrate; color filters recessed into the dielectric grid structure and respectively overlying the photodetectors, wherein the color filters have a refractive index greater than a refractive index of the dielectric grid structure; and a charge release layer disposed between the dielectric grid structure and the semiconductor substrate, wherein the charge release layer laterally surrounds the color filters, wherein a top surface of the charge release layer is above a top surface of the semiconductor substrate and a bottom surface of the charge release layer is vertically between the interconnect structure and the top surface of the semiconductor substrate.

In some embodiments, the present application provides a method for manufacturing a semiconductor structure for an image sensor, the method includes forming photodetectors within a semiconductor substrate; forming an interconnect structure on the semiconductor substrate, wherein the interconnect structure has a conductive wire layer; etching the semiconductor substrate to define a first opening in the semiconductor substrate; depositing an etch stop layer and a charge release layer over the semiconductor substrate and the interconnect structure, wherein the charge release layer overlies the etch stop layer, and wherein the charge release layer and etch stop layer line at least a portion of the first opening; forming a conductive contact in the first opening, wherein the conductive contact extends through the charge release layer and the semiconductor substrate to contact the conductive wire layer; depositing a grid dielectric layer over the photodetectors; etching the grid dielectric layer and the charge release layer until an upper surface of the etch stop layer is reached, wherein etching the grid dielectric layer defines a dielectric grid structure and a plurality of color filter openings overlying the photodetectors; and depositing a plurality of color filters in the plurality of color filter openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a semiconductor substrate;
   a photodetector disposed within the semiconductor substrate;
   an etch stop layer overlying the photodetector;
   a color filter overlying the etch stop layer;
   a dielectric grid structure surrounding the color filter;
   a charge release layer sandwiched between the dielectric grid structure and the etch stop layer, wherein the charge release layer surrounds the color filter and comprises a conductive material, and wherein the charge release layer directly contacts the color filter; and
   a ground pad overlying the semiconductor substrate and laterally offset from the dielectric grid structure, wherein the charge release layer is electrically coupled to ground via the ground pad.

2. The image sensor of claim 1, wherein the conductive material is titanium nitride, and wherein the etch stop layer comprises silicon nitride and the dielectric grid structure comprises silicon oxide.

3. The image sensor of claim 1, wherein a bottom surface of the color filter directly contacts a top surface of the etch stop layer, and wherein the dielectric grid structure directly contacts opposing sidewalls of the color filter.

4. The image sensor of claim 1, wherein the charge release layer has a ring shape directly contacting an outer perimeter of the color filter when viewed from above.

5. The image sensor of claim 1, wherein outer sidewalls of the photodetector are laterally spaced between inner sidewalls of the charge release layer.

6. The image sensor of claim 1, wherein inner sidewalls of the dielectric grid structure and inner sidewalls of the charge release layer are aligned.

7. The image sensor of claim 1, wherein an upper surface of the charge release layer is in direct contact with a bottom surface of the dielectric grid structure.

8. An image sensor, comprising:
   a semiconductor substrate having a front-side surface opposite a back-side surface;
   a plurality of photodetectors disposed within the semiconductor substrate;
   a dielectric grid structure overlying the back-side surface of the semiconductor substrate;
   color filters disposed within the dielectric grid structure and respectively overlying the photodetectors, wherein the dielectric grid structure continuously laterally surrounds the color filters;
   a conductive contact overlying the back-side surface of the semiconductor substrate, wherein the conductive contact comprises a contact protrusion that extends from above the back-side surface to a point below the front-side surface of the semiconductor substrate, wherein the conductive contact comprises a first conductive material; and
   a charge release layer disposed between the dielectric grid structure and the back-side surface of the semiconductor substrate, wherein the charge release layer continuously laterally surrounds the color filters, wherein the charge release layer contacts opposing sidewalls of the conductive contact, and wherein the charge release layer comprises a second conductive material different than the first conductive material.

9. The image sensor of claim 8, wherein the charge release layer comprises sidewalls in direct contact with sidewalls of the color filters.

10. The image sensor of claim 9, wherein a first thickness of the charge release layer in contact with the color filters is less than a second thickness of the charge release layer in contact with the conductive contact.

11. The image sensor of claim 9, wherein the dielectric grid structure comprises sidewalls in direct contact with the sidewalls of the color filters, wherein the sidewalls of the dielectric grid structure are aligned with the sidewalls of the charge release layer.

12. The image sensor of claim 8, further comprising:
   a ground pad overlying and contacting the conductive contact, wherein a top surface of the ground pad is disposed below a top surface of the conductive contact.

13. The image sensor of claim 12, wherein the charge release layer is electrically coupled to the ground pad by way of the conductive contact.

14. An image sensor, comprising:
   a semiconductor substrate comprising a front-side surface and a back-side surface that is opposite the front-side surface;
   a plurality of photodetectors disposed within the semiconductor substrate;
   a dielectric grid structure overlying the back-side surface of the semiconductor substrate;
   color filters recessed into the dielectric grid structure and respectively overlying the photodetectors, wherein the color filters have a refractive index greater than a refractive index of the dielectric grid structure;
   a charge release layer disposed between the dielectric grid structure and the semiconductor substrate, wherein the charge release layer laterally surrounds the color filters, wherein a top surface of the charge release layer is above the back-side surface of the semiconductor substrate and a bottom surface of the charge release layer is vertically between the front-side surface and the back-side surface of the semiconductor substrate; and
   a ground pad laterally offset from the color filters and over the semiconductor substrate, wherein a bottom surface of the ground pad is vertically between the front-side surface and the back-side surface of the semiconductor substrate, and wherein the charge release layer is electrically coupled to ground via the ground pad.

15. The image sensor of claim 14, further comprising:
   a conductive contact extending from above the back-side surface of the semiconductor substrate to a point below the front-side surface of the semiconductor substrate; and
   wherein the charge release layer continuously extends from over the photodetectors to directly contact a sidewall of the conductive contact.

16. The image sensor of claim 15, wherein the ground pad contacts and overlies the conductive contact.

17. The image sensor of claim 15, wherein the charge release layer has a first horizontal segment overlying the back-side surface of the semiconductor substrate, a vertical segment extending from the first horizontal segment through the back-side surface of the semiconductor substrate to a point below the back-side surface of the semiconductor substrate, and a second horizontal segment extending from the vertical segment to the sidewall of the conductive contact.

18. The image sensor of claim 17, wherein the point is vertically above an upper surface of the conductive contact.

19. The image sensor of claim 15, further comprising:
an etch stop layer overlying the back-side surface of the semiconductor substrate and continuously extending along a lower surface of the charge release layer, wherein the etch stop layer contacts the sidewall of the conductive contact.

20. The image sensor of claim 15, wherein the charge release layer comprises a first conductive material and the conductive contact comprises a second conductive material different than the first conductive material.

* * * * *